US008615398B2

(12) United States Patent  
Sampat et al.

(10) Patent No.: US 8,615,398 B2  
(45) Date of Patent: Dec. 24, 2013

(54) AUDIO CODING SELECTION BASED ON DEVICE OPERATING CONDITION

(75) Inventors: Kuntal Dilipsinh Sampat, San Diego, CA (US); Eddie L. T. Choy, Carlsbad, CA (US); Joel Linsky, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 942 days.

(21) Appl. No.: 12/362,119

(22) Filed: Jan. 29, 2009

(65) Prior Publication Data

US 2010/0191536 A1 Jul. 29, 2010

(51) Int. Cl.  
*G10L 19/00* (2013.01)

(52) U.S. Cl.  
USPC ........... 704/501; 704/500; 704/502; 704/503; 704/504

(58) Field of Classification Search  
USPC ................................................ 704/500–504  
See application file for complete search history.

(56) References Cited

U.S. PATENT DOCUMENTS

| | | | |
|---|---|---|---|
| 5,649,299 A | 7/1997 | Battin et al. | |
| 6,799,161 B2 | 9/2004 | Yokoyama | |
| 6,898,566 B1 | 5/2005 | Benyassine et al. | |
| 2003/0161292 A1 | 8/2003 | Silvester | |
| 2004/0225904 A1* | 11/2004 | Perez et al. | 713/320 |
| 2004/0247993 A1 | 12/2004 | Johnson et al. | |
| 2005/0202857 A1 | 9/2005 | Seshadri et al. | |
| 2006/0121955 A1 | 6/2006 | Shlomot | |
| 2006/0166715 A1 | 7/2006 | Van Engelen et al. | |
| 2006/0166716 A1 | 7/2006 | Seshadri et al. | |
| 2006/0291671 A1* | 12/2006 | Hyatt | 381/110 |
| 2007/0042762 A1 | 2/2007 | Guccione | |
| 2007/0149261 A1 | 6/2007 | Huddart | |
| 2007/0162278 A1* | 7/2007 | Miyasaka et al. | 704/201 |
| 2008/0146292 A1 | 6/2008 | Gilmore et al. | |
| 2008/0161066 A1 | 7/2008 | Reda et al. | |
| 2008/0161067 A1 | 7/2008 | Reda et al. | |
| 2009/0006104 A1 | 1/2009 | Sung et al. | |
| 2009/0189739 A1* | 7/2009 | Wang | 340/10.1 |

FOREIGN PATENT DOCUMENTS

| | | |
|---|---|---|
| JP | 7254878 A | 10/1995 |
| JP | 2001319407 A | 11/2001 |
| JP | 2002094443 A | 3/2002 |
| JP | 2002135127 A | 5/2002 |
| JP | 2002351495 A | 12/2002 |
| WO | WO0016498 A1 | 3/2000 |

OTHER PUBLICATIONS

International Search Report & Written Opinion—PCT/US2010/021665, International Search Authority—European Patent Office—May 19, 2010.  
Partial International Search Report—PCT/US2010/021665, International Search Authority—European Patent Office—Mar. 31, 2010.  
Taiwan Search Report—TW099102696—TIPO—Jan. 18, 2013.

\* cited by examiner

*Primary Examiner* — Leonard Saint Cyr  
(74) *Attorney, Agent, or Firm* — Espartaco Diaz Hidalgo

(57) ABSTRACT

A sensor is configured to determine at least one operating condition of a device and a selector is configured to select an audio coding process for the device, based on the operating condition. The operating condition may include remaining battery life of the device and/or ambient noise level. The selected audio coding process may consume less power than another possible audio coding process during audio processing. The audio may include voice and/or audio playback, e.g., music playback.

34 Claims, 14 Drawing Sheets

AUDIO CODING SELECTION BASED ON DEVICE OPERATING CONDITION

BACKGROUND

1. Field

This disclosure generally relates to audio communications, and more particularly, to devices that process encoded and/or compressed audio.

2. Background

Various audio coding techniques are known. Generally, contemporary audio coding involves processing digitized audio to reduce the size, i.e., bandwidth, of a digital signal representing the audio, while attempting to maintain the fidelity of encoded audio to the original audio signal. The audio coding process is frequently referred to as audio compression, and the coding processes themselves often reside in devices referred to as audio codecs. Audio coding processes may involve encoding and/or decoding operations.

Some audio coding algorithms, called lossy algorithms, remove information from the audio signal to reduce its bandwidth. However, the removal of audio information often results in noise being added to the encoded audio signal. Other types of audio coding algorithms, called lossless algorithms, use sophisticated signal processing techniques to remove only redundant information from the audio signal. These types of algorithms generally do not introduce noise into the processed audio signal, and thus, produce a higher quality encoded audio signal.

As briefly described above, various types of audio coding processes have different characteristics, be they audio quality, process complexity, compression rate, power consumption, process latency, or the like. In some circumstances, it would be desirable to have a device that could select among different audio coding processes to take advantage of the differences in their characteristics.

SUMMARY

Portable devices, such as wireless headsets or speakers, are usually power constrained, due to their small size. Disclosed herein are novel and non-obvious techniques that, among other things, reduce power consumption in portable devices by allowing these devices to select among different audio coding processes.

According to one aspect of this disclosure, an apparatus includes a sensor configured to determine at least one operating condition of a device and a selector configured to select a first audio coding process for the device, based on the operating condition. The first audio coding process causes the device to consume less power while processing audio than a second audio coding process. The audio may include voice and/or audio playback, e.g., music playback.

According to another aspect of this disclosure, a method comprises determining at least one operating condition of a device, and selecting a first audio coding process for the device based on the operating condition, where the first audio coding process causes the device to consume less power while processing audio than a second audio coding process.

According to another aspect of this disclosure, an apparatus includes means for determining an ambient noise level at a device, and means for selecting an audio coding process for the device from a plurality of audio coding processes, based on the ambient noise level.

According to a further aspect of this disclosure, a computer-readable medium, embodying a set of instructions executable by one or more processors, includes code for determining at least one operating condition of a device, and code for selecting a first audio coding process for the device, based on the operating condition. The first audio coding process causes the device to consume less power than a second audio coding process.

Other aspects, features, processes and advantages will be or will become apparent to one with skill in the art upon examination of the following figures and detailed description. It is intended that all such additional features, aspects, processes and advantages be included within this description and be protected by the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the techniques and devices described herein. In the figures, like reference numerals designate corresponding parts throughout the different views.

DETAILED DESCRIPTION

The following detailed description, which references to and incorporates the drawings, describes and illustrates one or more specific embodiments. These embodiments, offered not to limit but only to exemplify and teach, are shown and described in sufficient detail to enable those skilled in the art to practice what is claimed. Thus, for the sake of brevity, the description may omit certain information known to those of skill in the art.

The word "exemplary" is used throughout this disclosure to mean "serving as an example, instance, or illustration."

Anything described herein as "exemplary" is not necessarily to be construed as preferred or advantageous over other approaches or features.

Portable audio devices, i.e., those that use batteries, are often power constrained. To conserve battery power, the devices disclosed herein select audio coding formats having different power consumption levels based on one or more operating conditions of the devices. For example, if the device's battery power level is low, a lower power audio coding format is selected to extend the battery life.

Figure 1:
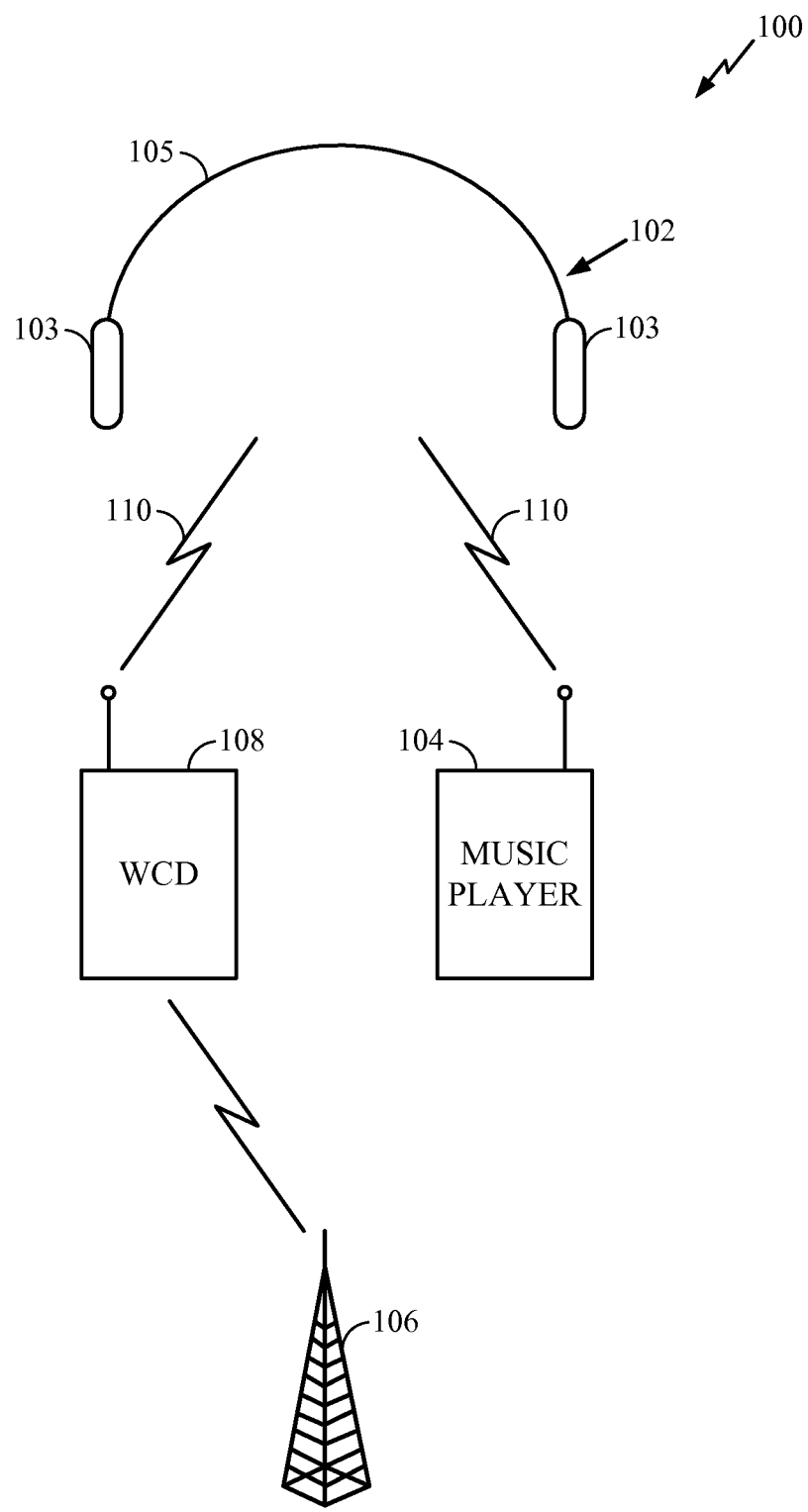
FIG. 1 is a diagram showing an exemplary communication system including a wireless headset.

Turning now to the drawings, and in particular to FIG. 1, there is shown an exemplary communication system 100 including a wireless headset 102. The system 100 includes the wireless headset 102, which is capable of communicating with one or more audio sources, e.g., a first audio source, such as a music player 104, and a second audio source, such as a wireless communication device (WCD) 108, over one or more wireless links 110. Although illustrated as a music player 104 and WCD 108, the audio sources may be any device capable of transmitting audio signals to the headset 102 such that the audio represented by the audio signals can be output from speakers in the headset 102.

In the exemplary communication system 100, the music player 104, WCD 108 and headset 102 are configured select audio coding formats having different power consumption levels based on one or more operating conditions of the headset 102. The purpose is to conserve battery power in the headset 102. During services negotiations between the headset 102 and either the WCD 108 or music player 104, there are essentially two approaches to determining which audio coding process should be used: 1) the headset 102 determines its operating condition and advertises to the WCD 108 or music player 104 which audio coding process should be used; or 2) the WCD 108 or music player 104 queries the headset 102 for its operating condition and accordingly selects the audio coding process based on the operating condition.

Although the system 100 and headset 102 are not limited to MP3 formatted music, the music player 104 may be an MP3 music player.

Although the exemplary communication system 110 illustrates the WCD 108 and music player 104 as being separate devices, the functions of the two devices can be combined into a single wireless device, i.e., a combined two-way communication device and music player.

The WCD 108 may be any suitable communication device capable of two-way radio communications, e.g., mobile radio, cordless phone, personal digital assistant (PDA), cellular subscriber unit, personal computer, laptop computer or the like. In the example shown, the WCD 108 is a device capable of communicating with one or more base stations within a wireless communication network 106. Examples of suitable wireless communications networks 106 include, but are not limited to, WiFi, WiMAX, code-division multiple access (CDMA) based networks, WCDMA, GSM, UTMS, AMPS, PHS networks or the like. The wireless network 106 includes infrastructure comprising those network elements necessary to support wireless voice and/or data communications with the WCD 108. The wireless communication infrastructure includes equipment such as controllers, transceivers and backhaul that establishes and maintains wireless communication with the WCD 108, as well as other terminal devices. The types and numbers of devices within the wireless infrastructures depend on the particular wireless network. For example, a typical cellular network includes sector antennas connected to several base transceiver stations (BTSs) connected to base station controllers (BSCs) that are connected to a mobile switching center(s) (MSC). Cellular base station controllers are typically capable of communicating with an IP-based network, such as the Internet, via a packet data server node (PDSN). Base stations are also capable of communicating with the public switched telephone network (PSTN) via the MSC. Thus, conventional cellular base stations included in the wireless network 106 use the MSC and PSTN to provide conventional voice connections and telephony services between the WCD 108 and other telephone devices, such as conventional landline phones.

The audio signals transmitted to and from the headset 102 can represent any form of discernible sound, including but not limited to voice and monaural or stereo audio. The audio signals transmitted between the audio sources and the headset 102 over the wireless channels can represent digitized audio sampled at the industry standard rate of 44.1 KHz. Other standard rates are 8 kHz, 16 kHz, 48 kHz, and other rates may also be used.

The wireless links 110 may be any suitable wireless communication channels, including a radio frequency (RF) channel or infrared (IR) channel between the headset 102 and audio sources 104, 108, using any suitable communications protocol for transferring audio from either audio source 104, 108 to the headset 102. In the example shown, each wireless link 110 may be a Bluetooth wireless link.

The audio may include Bluetooth streaming audio resulting from a connection established between the music player 104 and the headset 102, as described in the A2DP specification. After the Bluetooth streaming audio connection is established, audio packets are transmitted from the first audio source to the headset 102. Generally, the audio packets include digitized audio that is encoded using a negotiated codec standard. Each audio packet represents a predetermined duration of sound, e.g., 20 milliseconds, that is to be output at the headset 102. The audio packets can be formatted according to the A2DP profile, including one or more frames of encoded audio. The audio can be encoded using any suitable audio codec, including but not limited to raw pulse-code modulation (PCM), SBC, ADPCM, AAC, WMA, Real, MPEG-1 audio, MPEG-2 audio and the like.

The exemplary wireless headset 102 includes two earpieces 103 and one optional support, such as a headband 105, for allowing the headset 102 to be comfortably worn by a user.

Wireless headsets are used to provide a greater degree of user freedom, as the user is no longer tethered to the audio source by a wire. Conventional wired headsets include a wire running between an audio source and either one or two earpieces that are intended to fit on or within a user's ears. In many cases, wireless headsets are simply replacements for wired headsets. In such circumstances, a wireless headset substitutes a wireless link, usually an RF or IR channel, for the wire running between the headset and audio source. Both wired and wireless headsets may be used with audio sources such as communication devices, e.g., cordless telephones, mobile radios, personal digital assistants (PDAs), cellular subscriber units and the like, as well as other source devices, such as MP3 players, stereo systems, radios, video games, personal computers, laptop computers and the like.

Wireless headsets communicate with audio sources using RF or IR wireless technology. Such wireless headset communications have been extended to personal wireless networks, such as the one defined by the Bluetooth Specification available at www.bluetooth.com. The Bluetooth Specification provides specific guidelines for providing wireless headset functionality. In particular, the Bluetooth Specification provides a Headset Profile that defines the requirements for Bluetooth devices necessary to support the Headset use case. Once configured, the headset can function as a device's audio input and/or output. Thus, a particularly popular use of Bluetooth networks is to provide wireless headset connectivity for cellular telephones and PDAs. In addition, the Bluetooth Specification also provides the Advanced Audio Distribution Profile (A2DP) that defines protocols and procedures for wirelessly distributing high-quality stereo or mono audio over a Bluetooth network. The purpose of this Profile is to connect to MP3 music players such as the Zune, iPod, and the like.

Although illustrated with the headband 105, the headset 102 and earpieces 103 can having any suitable physical shape and size adapted to securely fit the earpieces 103 over or into a user's ears. The headband 105 may be optionally omitted from the headset 102. For example, the earpieces 103 can be conventional hook-shaped earpieces for attaching behind a user's earlobe and over or into the user's ear canal. In addition, although the headset 102 is illustrated as having two earpieces 103, the headset 102 may alternatively include only a single earpiece.

Figure 2:
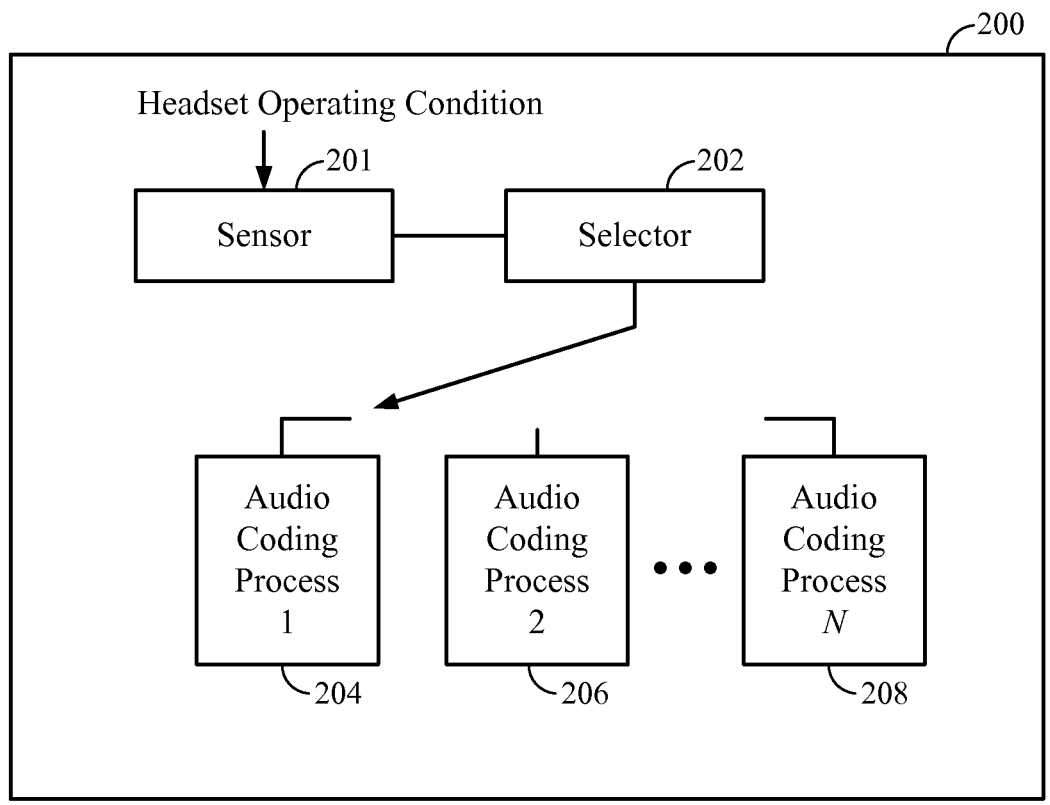
FIG. 2 is a block diagram illustrating certain components of a wireless headset.

FIG. 2 is a block diagram illustrating certain components of an exemplary wireless headset 200. The wireless headset 200 may be included in the communication system 100 as the headset 102, and may include the features and functions of the wireless headset 102.

The wireless headset 200 includes a sensor 210, a selector 202 and a plurality of audio coding processes 204, 206, 208. The sensor 201 monitors at least one operating condition of the headset 200. The sensor 201 reports the headset operating condition to the selector 202. The selector 202 then selects one of the audio coding processes 204, 206, 208 based on the operating condition. The operating condition measured by the sensor 201 may be a remaining battery energy capacity, which may be based on a battery voltage level, an ambient noise level measured at the headset 200, or a combination of the remaining battery energy capacity and the ambient noise level. The sensor 201 may also determine the strength of an incoming audio signal so that a signal-to-noise ratio (SNR) of the audio signal to the ambient noise level may be computed. The reported operating condition may include the SNR, and thus, the selector 202 may base its selection on the SNR, or a combination of the other operating conditions and the SNR.

Each of the audio coding processes 204, 206, 208 includes an audio decoding process that may be implemented as an audio codec. The audio coding processes 204, 206, 208 may each be one of PCM, SBC, ADPCM, AAC, WMA, Real, MPEG-1 audio, MPEG-2 audio or the like. The audio coding processes 204, 206, 208 may be implemented using software, hardware or any suitable combination of hardware components and software programs.

The sensor 201 can be implemented using hardware, software or any suitable combination thereof. For example, the sensor 201 may include a commercially available power meter module for monitoring battery power levels. The sensor 201 may also include one or more microphones (not shown) for measuring noise levels at the headset 200, coupled with audio processing circuitry for processing signals from the microphones.

The selector 202 can be implemented as a processor executing a software program for reading output from the sensor 201 and comparing the sensor output to various thresholds to select an appropriate audio coding process. Specific examples of operating conditions and selection processes are described herein below.

After selecting one of the audio coding processes, the headset 200 then advertises its selection to any device attempting to download or stream encoded audio to the headset 200. In a Bluetooth wireless system, the advertisement can be accomplished using the Service Discovery Protocol (SDP). With SDP, when an external device requests service information from the headset 200, the headset 200 may provide the identity of the selected audio coding process in a response to the SDP service request. The external device may then configure its audio coding process to correspond to the process selected by the headset 200.

The ability to select between different encoding processes may eliminate or reduce the need to transcode from one audio encoding format to another audio encoding format. It is desirable to avoid transcoding between lossy audio coding formats, since that usually results in additional noise.

Figure 3:
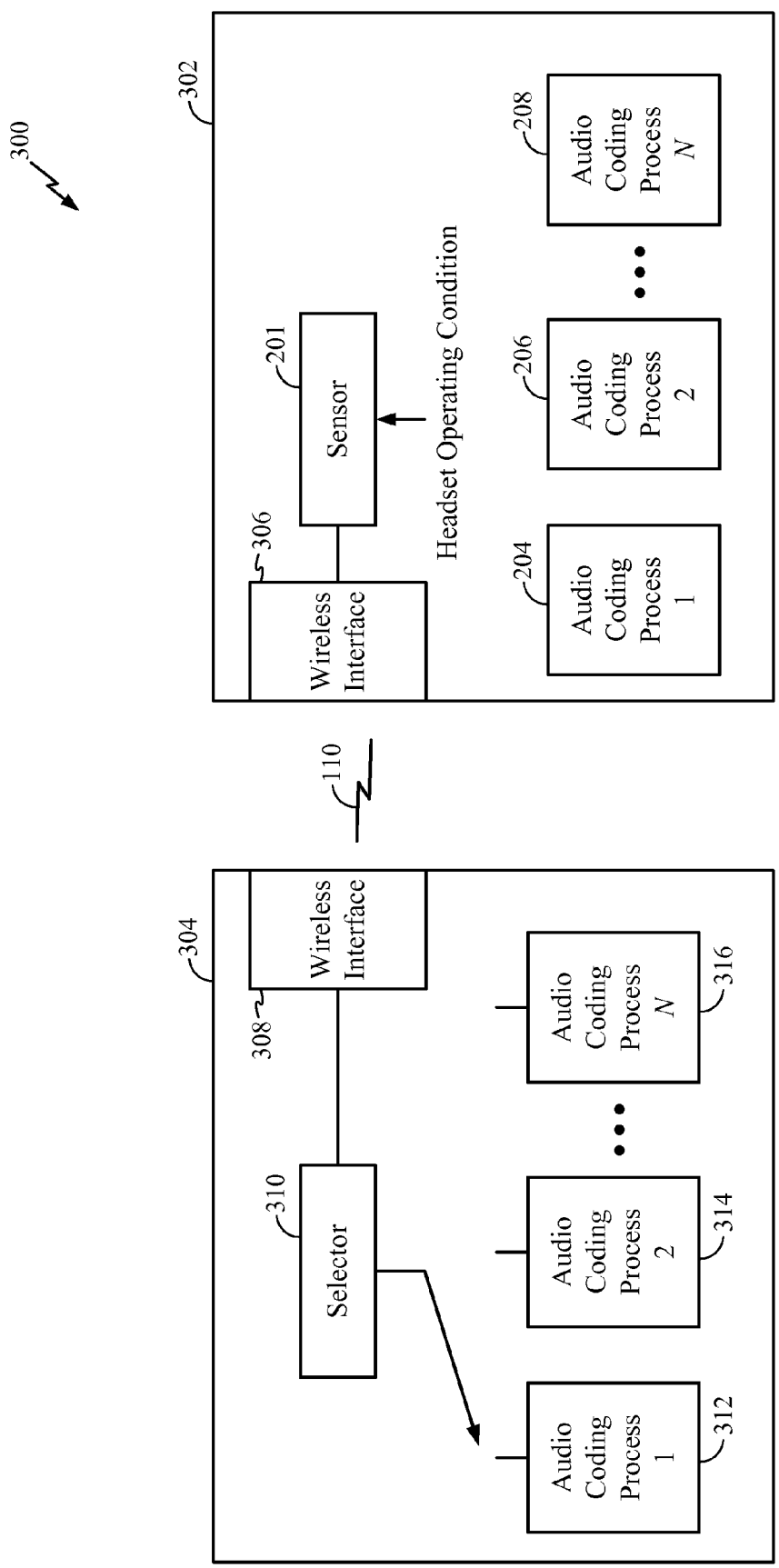
FIG. 3 is a block diagram illustrating certain components of a first wireless headset system.

FIG. 3 is a block diagram illustrating certain components of a first wireless headset system 300. The wireless headset system 300 includes a wireless headset 302 and an audio source 304, each capable of communicating with one another over the wireless link 110. The wireless headset system 300 may be included in the communication system 100. In this case, the audio source 304 may act as and include the features and functions of the WCD 108 and/or the music player 104, and the wireless headset 302 may act as and include the features and functions of the wireless headset 102.

The wireless headset 302 includes a wireless interface 306 for communicating with the audio source 304 over the wireless link 110. The wireless headset also includes the sensor 201 for monitoring at least one headset operating condition. The wireless interface 306 is configured to communicate the headset operating condition to the audio source 304 by way of the wireless link 110.

The audio source 304 includes a wireless interface 308 for communicating with the wireless headset 302 over the wireless link 110. The audio source 304 also includes a selector 310 and a plurality of audio coding processes 312, 314, 316. The selector 310 receives the headset operating condition from the wireless interface 308. The selector 310 then selects one of the audio coding processes 312, 314, 316 based on the operating condition. The headset operating condition(s) provided to the selector 310 can be those described herein above in connection with FIG. 2.

Each of the audio coding processes 312, 314, 316 includes an audio encoding process that may be implemented as an audio codec. The audio coding processes 312, 314, 316 may each be one of PCM, SBC, ADPCM, AAC, WMA, Real, MPEG-1 audio, MPEG-2 audio or the like. At least one of the processes 312, 314, 316 corresponds to one the audio coding processes 204, 206, 208 of the headset 302. The audio coding processes 312, 314, 316 may be implemented using software, hardware or any suitable combination of hardware components and software programs.

The selector 310 can be implemented as a processor executing a software program for reading output from the wireless interface 308 and comparing the sensor output to various thresholds to select an appropriate audio coding process. Specific examples of operating conditions and selection processes are described herein below.

The wireless interfaces 306, 308 may be Bluetooth wireless interface modules.

In operation, the audio source 304 first queries the headset 302 for its operating condition via the wireless link 110. After receiving the operating condition at the audio source 304, the selector 310 selects one of the audio coding processes 312, 314, 316 based on the headset operating condition and coding processes available at the headset 302. The audio source 304 then indicates its selection to the headset 302, which configures its corresponding audio coding process 204, 206 or 208 to decode incoming encoded audio. The audio source 304 then begins to transmit encoded audio to the headset 302.

Using a Bluetooth wireless system, the operating condition querying can be accomplished using the SDP. The selected audio coding process can be indicated by appropriate data fields at the start of audio streaming using the A2DP. If formats do not match, then audio source 304 may transcode audio to a format supported by headset 302.

Figure 4:
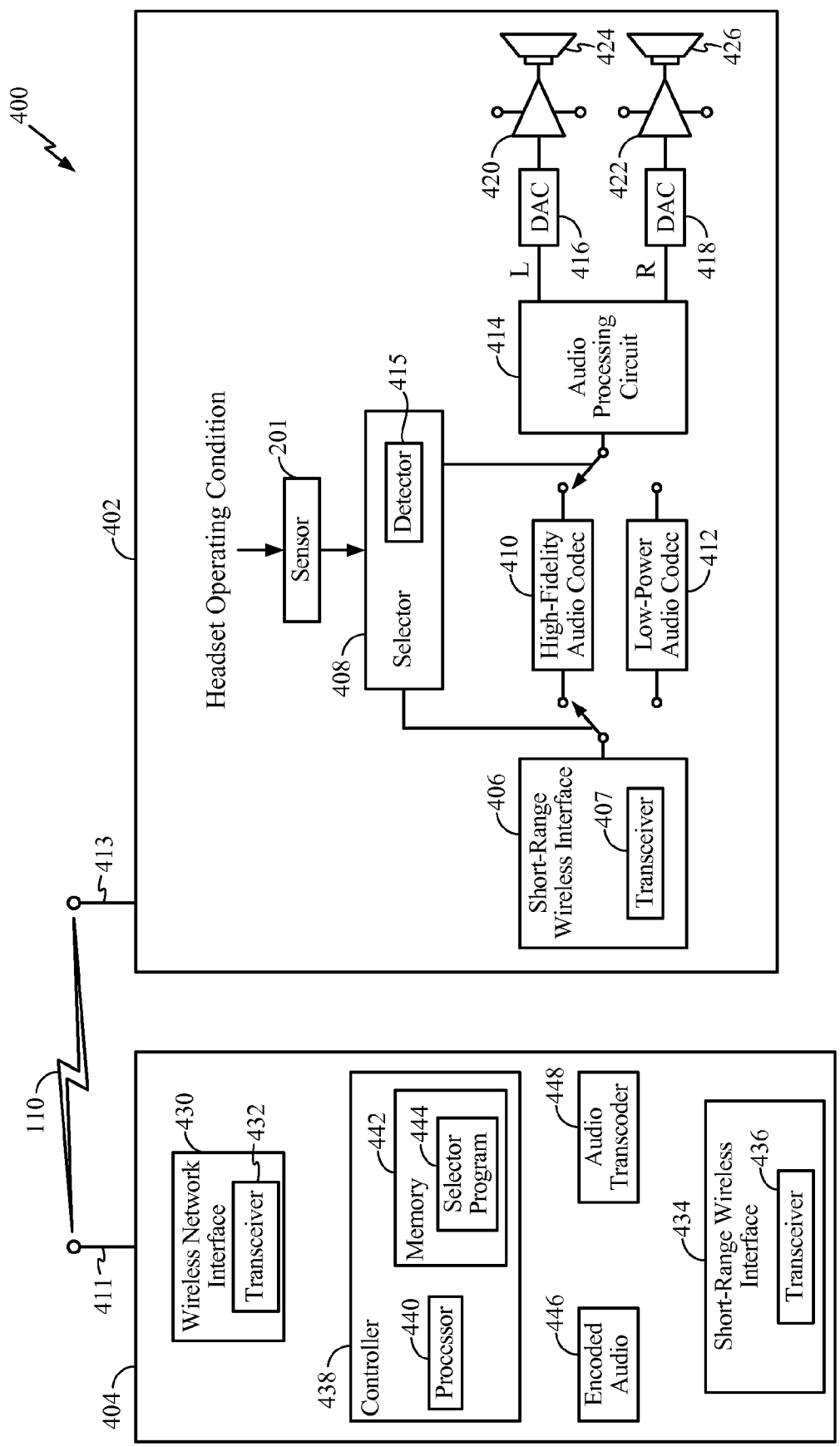
FIG. 4 is a block diagram illustrating certain components of a second wireless headset system.

FIG. 4 is a block diagram illustrating certain components of a second wireless headset system 400. The wireless headset system 400 includes a wireless headset 402 and a WCD 404, each capable of communicating with one another over the wireless link 110. The wireless headset system 400 may act as the headset 102 and be included in the communication system 100. The WCD 404 may act as and include the features and functions of the WCD 108 and/or the music player 104; and the wireless headset 402 may include the features and functions of the wireless headset 102.

The wireless headset 402 includes an antenna 413, a short-range wireless interface 406 for communicating with the WCD 404 over the wireless link 110. The wireless headset 404 also includes the sensor 201, a selector 408, a high-fidelity audio codec 410, a low-power audio codec 412, audio processing circuitry 414, a left-channel digital-to-analog converter (DAC) 416, a right-channel DAC 418, a left-channel HPH amplifier (Amp) 420, a right-channel HPH amplifier (Amp) 422, a left-channel earphone speaker 424, and a right-channel earphone speaker 426.

The sensor 201 monitors at least one headset operating condition and reports the operating condition to the selector 408.

The selector 408 selects either the high-fidelity audio codec 410 or the low-power audio codec 412, based on the headset operating condition. The selector includes a detector 415 configured to detect one or more boundaries in an incoming audio stream. The selector 408 is configured to switch to between the audio codecs 410, 412 at one of the boundaries. The boundaries may include periods of silence, as described below in connection with FIG. 12.

The short-range wireless interface 406 includes a transceiver 407 and provides two-way wireless communications with the WCD 404. Although any suitable wireless technology can be employed with the headset 402, the short-range wireless interface 406 preferably includes a commercially-available Bluetooth module that provides at least a Bluetooth core system consisting of the antenna 413, a Bluetooth RF transceiver, baseband processor, protocol stack, as well as hardware and software interfaces for connecting the module to the audio codecs 410, 412, selector 408 and other components, if required, of the headset 402.

Digitized audio streams are output from the short-range wireless interface 406, and decoded by either the high-fidelity codec 410 or the low-power audio codec 412, depending on the audio coding process that is selected by the selector 408. The coding process of the digitized audio stream may be any suitable scheme compatible with codecs 410, 412, and thus, the audio stream may, in some circumstances, be raw audio samples, such as PCM samples, or in other circumstances, digitally encoded and/or compressed audio, such as SBC, ADPCM, AAC, WMA, Real, MPEG-1 audio, MPEG-2 audio or the like.

The high-fidelity codec 410 includes an audio decoding process that consumes more power during operating than the audio decoding process of the low-power codec 412. Generally, the amount of power consumed by an audio codec is directly related to the computational complexity of the codec, as measured in millions of instruction per second (MIPS). If a codec executes a larger number of MIPS, it generally consumes more power than a codec operating at a lower number of MIPS. The high-fidelity codec 410 can be an AAC, WMA, Real, MPEG-1 audio, MPEG-2 audio codec or the like; and the low-power codec can be an SBC codec.

The audio processing circuit 414 includes digital circuitry to process the decoded digitized audio signals in the digital domain. For example, decoded audio stream may be truncated one or more times, filtered one or more times, amplified one or more times, and upsampled one or more times by the audio processing circuit 414. Filtering may include low pass filtering, high pass filtering, and/or passing the stream through filters characterized by other kinds of filter functions. Amplification in the digital domain may include the use of a programmable gain amplifier (PGA).

The audio processing circuit 414 may be implemented using commercially-available, off-the-shelf components. The circuit 414 may include audio processing circuitry for processing the left and right channels separately. Alternatively, the audio processing circuit 414 may include a single, multiplexed audio processing path that handles both left and right audio channels. Also, some or all of the functions of the audio processing circuit 414 may be implemented as software executable on a processor.

The left-channel DAC 416 converts left-channel digitized audio output from the audio processing circuit 414 into a left-channel analog audio signal. The left channel analog audio signal is then amplified by the audio amplifier 416 to drive the left speaker 424.

The right-channel DAC 418 converts right-channel digitized audio output from the audio processing circuit 414 into a right-channel analog audio signal. The right-channel analog audio signal is then amplified by the audio amplifier 422 to drive the right speaker 426.

One of ordinary skill in the art will understand that additional analog audio processing circuitry (not shown), beyond the audio amplifiers 214, 222, may be included in the headset 402.

The left and right headset speakers 424, 426 are any suitable audio transducer for converting the electronic signals output from the amplifiers 420, 422, respectively, into sound.

The WCD 404 includes a wireless wide-area network (WWAN) interface 430, one or more antennas 411, a short-range wireless interface 436, a controller 438 having a processor 440 and a memory 442 storing a selector program 444, encoded audio 446 stored on the WCD 404, and an audio transcoder 448. The WCD 404 can include separate antennas for communicating over the short-range wireless link 110 and a WWAN link, or alternatively, a single antenna may be used for both links.

The WWAN interface 430 comprises the entire physical interface necessary to communicate with a WWAN, such as the wireless network 106 described above in connection with FIG. 1. The interface 430 includes a wireless transceiver 432 configured to exchange wireless signals with a WWAN. The WWAN interface 430 exchanges wireless signals with the WWAN to facilitate voice calls and data transfers over the WWAN to a connected device. The connected device may be another WWAN terminal, a landline telephone, or network service entity such as a voice mail server, Internet server or the like.

The short-range wireless interface 434 includes a transceiver 4436 and provides two-way wireless communications with the wireless headset 402. Although any suitable wireless technology can be employed with the WCD 404, the short-range wireless interface 436 preferably includes a commercially-available Bluetooth module that provides at least a Bluetooth antenna, Bluetooth core system consisting of a Bluetooth RF transceiver, baseband processor, protocol stack, as well as hardware and software interfaces for connecting the module to the controller 438 and other components, if required, of the WCD 404.

The controller 438 is configured to control overall operation of the WCD 404. The selector program 444 is executable by the processor 440 to select either the encoded audio 446 or transcoded audio output from the audio transcoder 448 for downloading to the headset 402, based on the audio coding process selected at the headset 402. The selector program 444 receives indication of the selected audio coding process from the headset 402 via the short-range wireless interface 434.

The encoded audio 446 can include one or more files of encoded audio for playback. The format of the encoded audio 446 may corresponds to the format used by the high-fidelity codec 410, and may be any of the audio encoding formats described herein. The encoded audio 446 may be stored in memory 444, or alternatively, in a separate mass storage device (not shown), such as a flash memory, included in the WCD 108.

The audio transcoder 448 transcodes the encoded audio 446 to the format required by the low-power codec 412, when that codec is selected by the headset 402. As an alternative to the audio transcoder 448, the WCD 404 may instead include stored audio that is encoded in the format used by the low-power codec 412. Also, in an alternative arrangement, the encoded audio 446 may be in the format corresponding to the low-power codec 412, and the transcoded audio may be in the format corresponding to the high-fidelity codec 410.

The components of the WCD 404 and headset 402 may be implemented using any suitable combination of analog and/or digital hardware, firmware and/or software.

Figure 5:
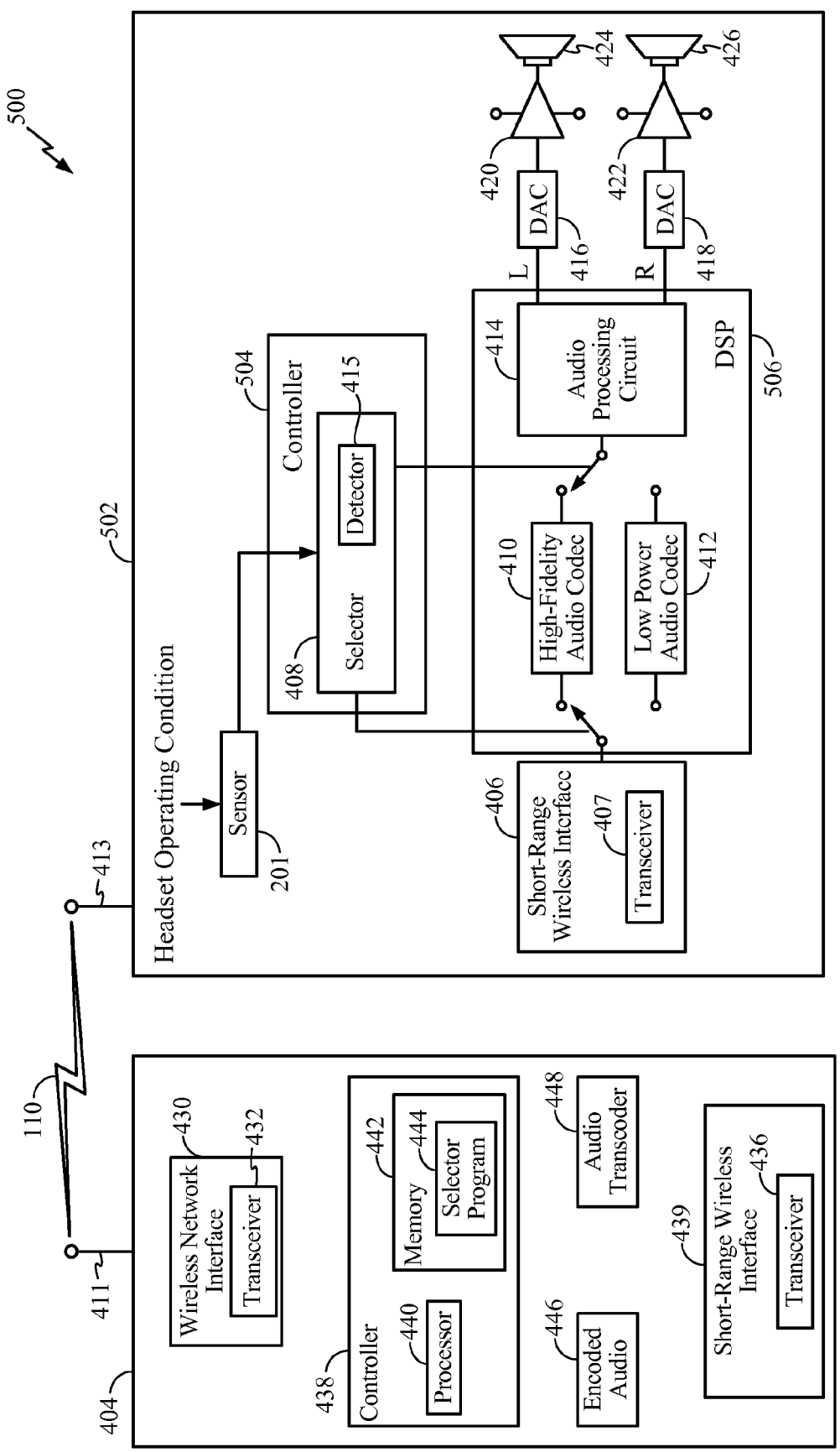
FIG. 5 is a block diagram illustrating certain components of a third wireless headset system.

FIG. 5 is a block diagram illustrating certain components of a third wireless headset system 500. The wireless headset system 500 includes a wireless headset 502 and the WCD 404, each capable of communicating with one another over the wireless link 110. The wireless headset system 500 may be included in the communication system 100. The wireless headset 502 may act as and include the features and functions of the wireless headset 102.

The headset 502 includes a multi-processor architecture that includes a controller 504 for implementing at least the selector 408. The controller 502 may also control the overall operation of the headset 502 and certain components contained therein. The controller 504 may include a processor, which can be any suitable processing device for executing programming instructions stored in a memory to cause the headset 502 to perform its functions and processes as described herein. For example, the processor can be a microprocessor, such as an ARM7, digital signal processor (DSP), one or more application specific integrated circuits (ASICs), field programmable gate arrays (FPGAs), complex programmable logic devices (CPLDs), discrete logic, software, hardware, firmware or any suitable combination thereof. The memory is any suitable memory device for storing programming instructions and data executed and used by the processor.

The headset 502 also includes a DSP 506 for implementing the high-fidelity codec 410, low-power codec 412 and at least a portion of the audio processing circuit 414. The DSP 506 is in communication with the controller 504 though one or more buses and control signals.

The headsets 402, 502 may also include a microphone (not shown) configured to produce an input audio signal that is preprocessed by a microphone preprocessor (not shown). The output of the microphone preprocessor may be provided to the transceiver, where it may then be provided to the audio processing path in the headsets 402, 502 and/or the WCD 404 over the wireless link 110. The microphone may be any suitable microphone device for converting sound into electronic signals.

The microphone preprocessor is configured to process electronic signals received from the microphone. The microphone preprocessor may include an analog-to-digital converter (ADC) and a noise reduction and echo cancellation circuit (NREC). The ADC converts analog signals from the microphone into digital signal that are then processed by the NREC. The NREC is employed to reduce undesirable audio artifacts for communications and voice control applications. The microphone preprocessor may be implemented using commercially-available hardware, software, firmware, or any suitable combination thereof.

The microphone and microphone preprocessor may also be configured to provide ambient noise signals to sensor 201.

Figure 6:
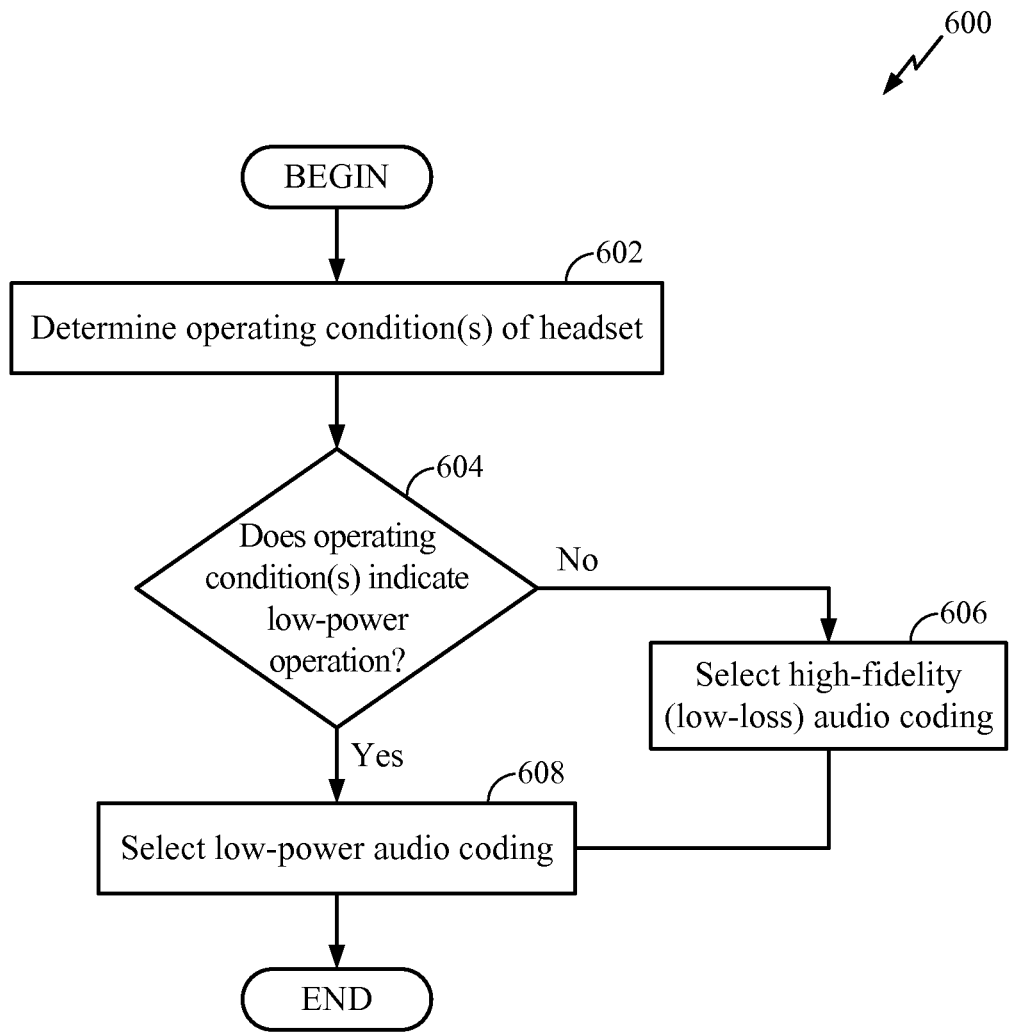
FIG. 6 is a flowchart illustrating a first method of selecting an audio coding process for a wireless headset.

FIG. 6 is a flowchart illustrating a first method 600 of selecting an audio coding process for a wireless headset. In block 602, at least one operating condition of the headset is determined. In decision block 604, the headset operating condition is checked to decide whether the headset operation condition indicates the need to operate the headset in a low-power mode. If so, a low-power audio coding process is selected for the headset (block 608). If not, a high-fidelity audio coding process is selected for the headset (block 606). The low-power audio coding process consumes less power than the high-fidelity audio coding process during audio processing at the headset.

Figure 7:
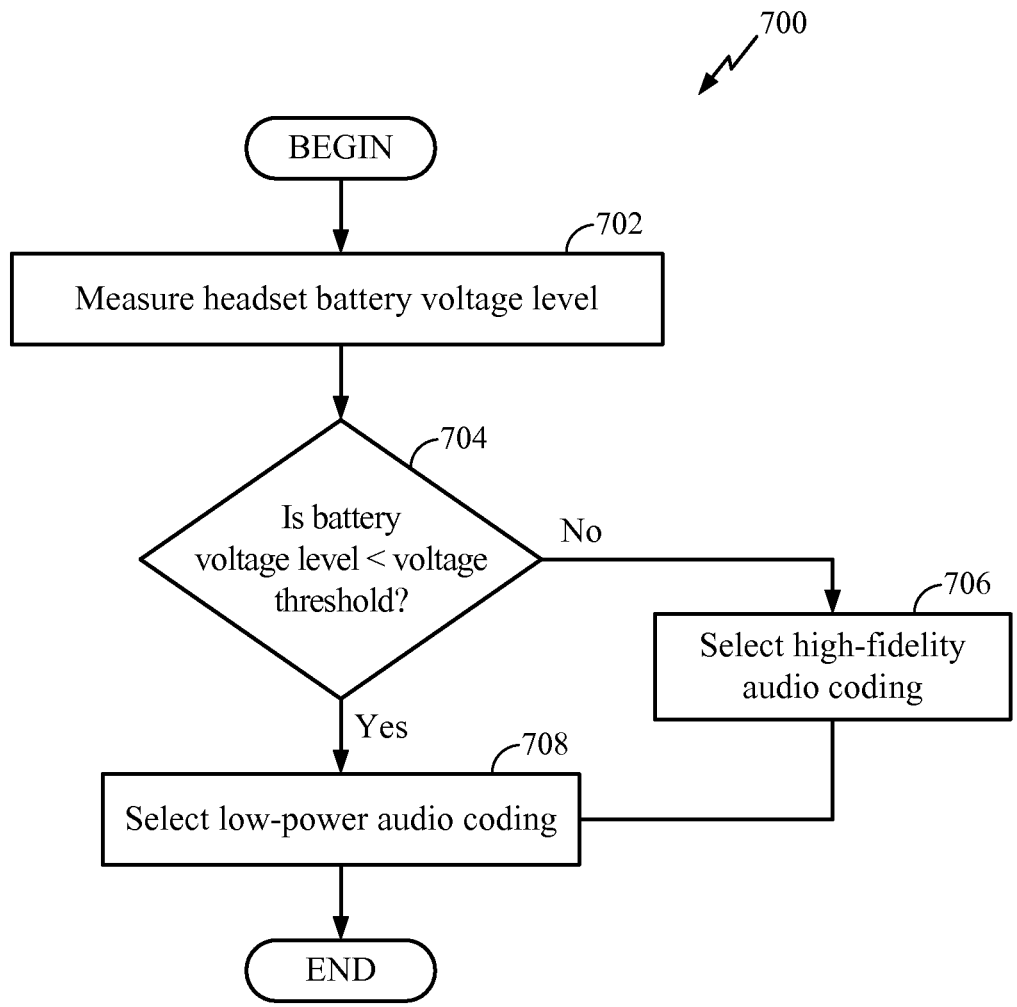
FIG. 7 is a flowchart illustrating a second method of selecting an audio coding process for a wireless headset.

FIG. 7 is a flowchart illustrating a second method 700 of selecting an audio coding process for a wireless headset. In block 702, the battery voltage level, which indicates the remaining battery energy capacity of the headset, is measured. In decision block 704, the battery voltage level is compared to a voltage threshold value to determine whether the battery is running low, and thus, indicating a need to operate the headset in a low-power mode. If the measured battery voltage level is below the threshold, a low-power audio coding process is selected for the headset (block 708). If not, a high-fidelity audio coding process is selected for the headset (block 706). The low-power audio coding process consumes less power than the high-fidelity audio coding process during audio processing at the headset, and thus allows the headset to operate longer.

Figure 8:
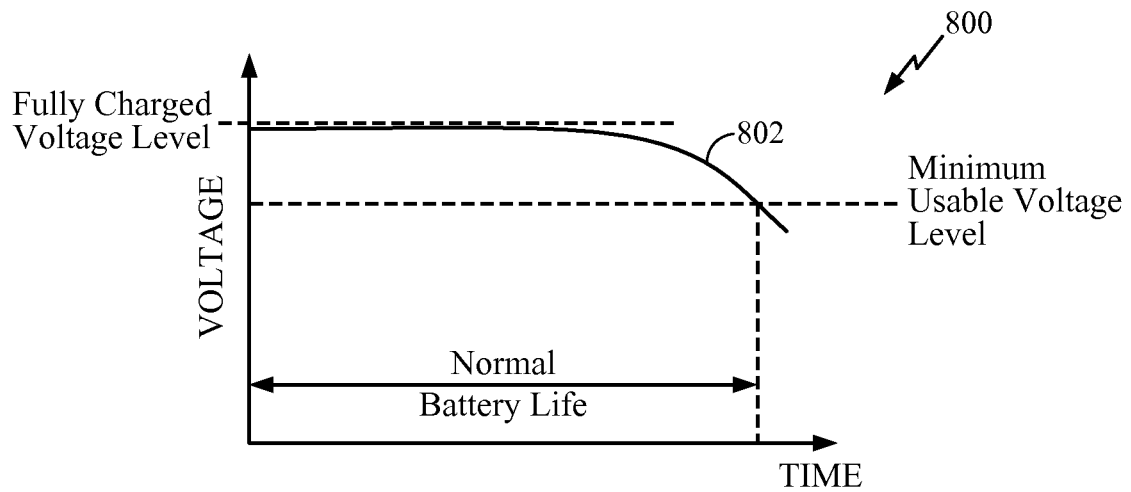
FIG. 8 is a graph illustrating normal headset battery life.

FIG. 8 is an exemplary graph 800 illustrating normal headset battery life. When the battery is new or fully charged, its output voltage level is at or about a fully charged voltage level. The curve 802 shows the battery voltage level as it decreases as the battery discharges over time while the headset is operating. At some point during operation, the headset battery discharges enough of its stored energy that the battery output voltage level begins to decrease. If the battery is not recharged, the battery output voltage level eventually decreases to or below a minimal usable voltage level. The headset quits operating at the minimal usable voltage level.

A typical Bluetooth headset battery is either one or more AAA batteries or a 2.4V 350 mAh battery. The voltage that is supplied by the headset battery over time may be represented as shown in FIG. 8.

Figure 9:
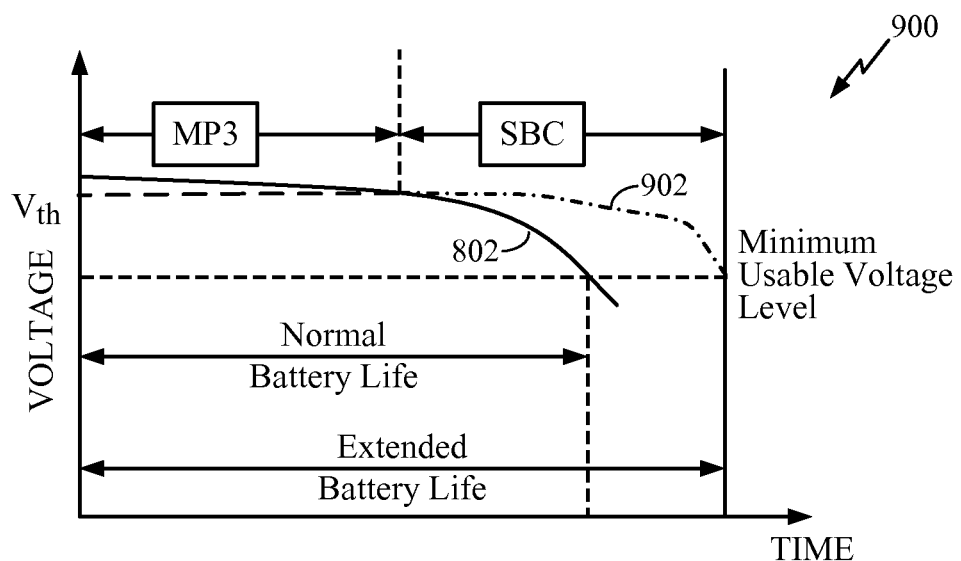
FIG. 9 is a graph illustrating normal and extended headset battery life, where the extended battery life is caused by switching to lower-power audio coding.

FIG. 9 is an exemplary graph 900 illustrating normal and extended headset battery life, where the extended battery life is caused by switching the headset to lower-power audio coding when the battery output voltage level drops to a voltage threshold value, $V_{th}$. In the example shown, when the battery output voltage level reaches $V_{th}$, the headset switches from the MP3 audio coding (which is a higher-fidelity, higher-power coding scheme) to SBC audio coding (which is a lower-fidelity, lower-power coding scheme). The curve 802 shows the battery output voltage level without switching (normal battery life). The curve 902 shows the battery output voltage level with switching (extended battery life). By selectively switching to the low-power coding scheme, the headset battery life may be significantly extended. During music playback, the switching between coding processes can happen at song boundaries, so there are no perceivable audio glitches.

Some batteries themselves provide measures of their charge levels, in that case, the switching voltage threshold $V_{th}$ can be chosen to be 20% of the maximum battery charge.

Figure 10:
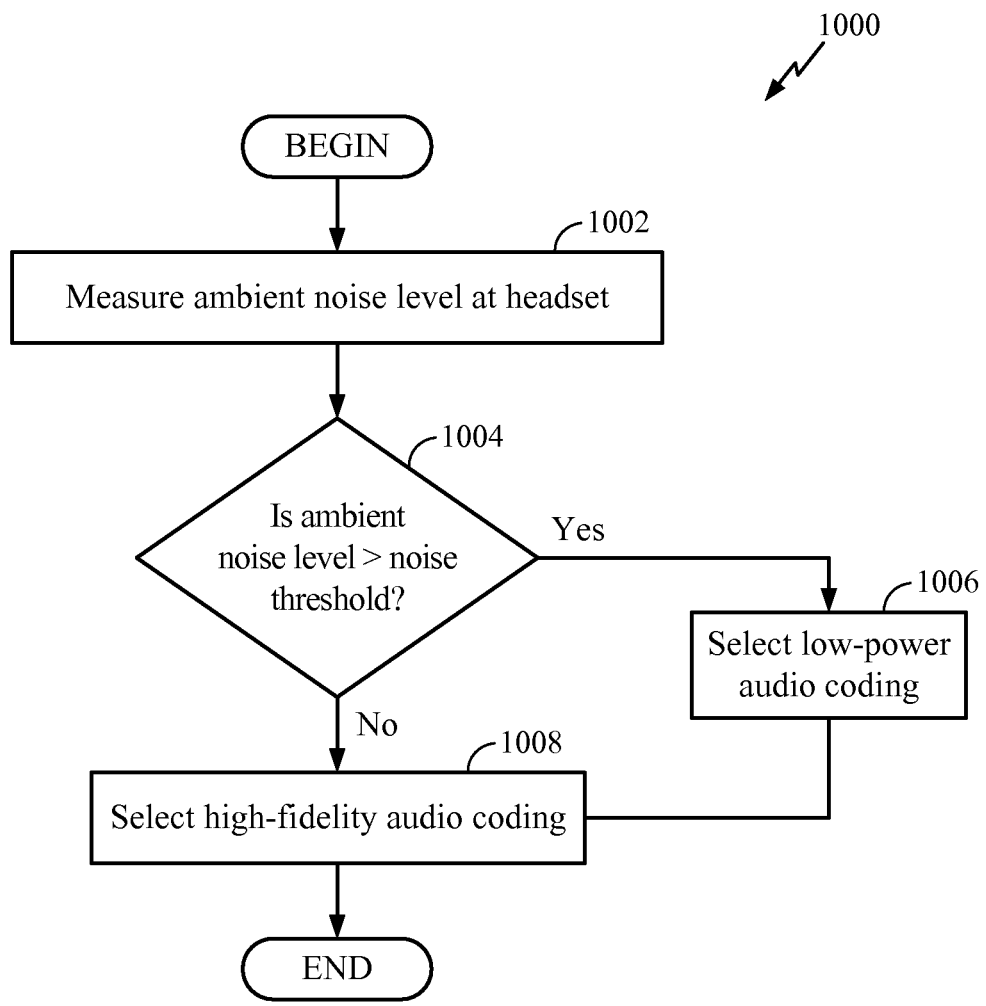
FIG. 10 is a flowchart illustrating a third method of selecting an audio coding process for a wireless headset.

FIG. 10 is a flowchart illustrating a third method 1000 of selecting an audio coding process for a wireless headset. In block 1002, the ambient noise level at the headset is measured. In decision block 1004, the ambient noise level is compared to a noise threshold value to determine whether the headset is in an environment that is noisy enough that a user would not typically hear the difference between audio output from a low-fidelity codec or high-fidelity audio codec. If the measured ambient noise level is above the threshold value, a low-power, low-fidelity audio coding process is selected for the headset (block 1006). If not, a high-fidelity audio coding process is selected for the headset (block 1008). The low-power audio coding process consumes less power than the high-fidelity audio coding process during audio processing at the headset, and thus allows the headset to operate longer.

Figure 11:
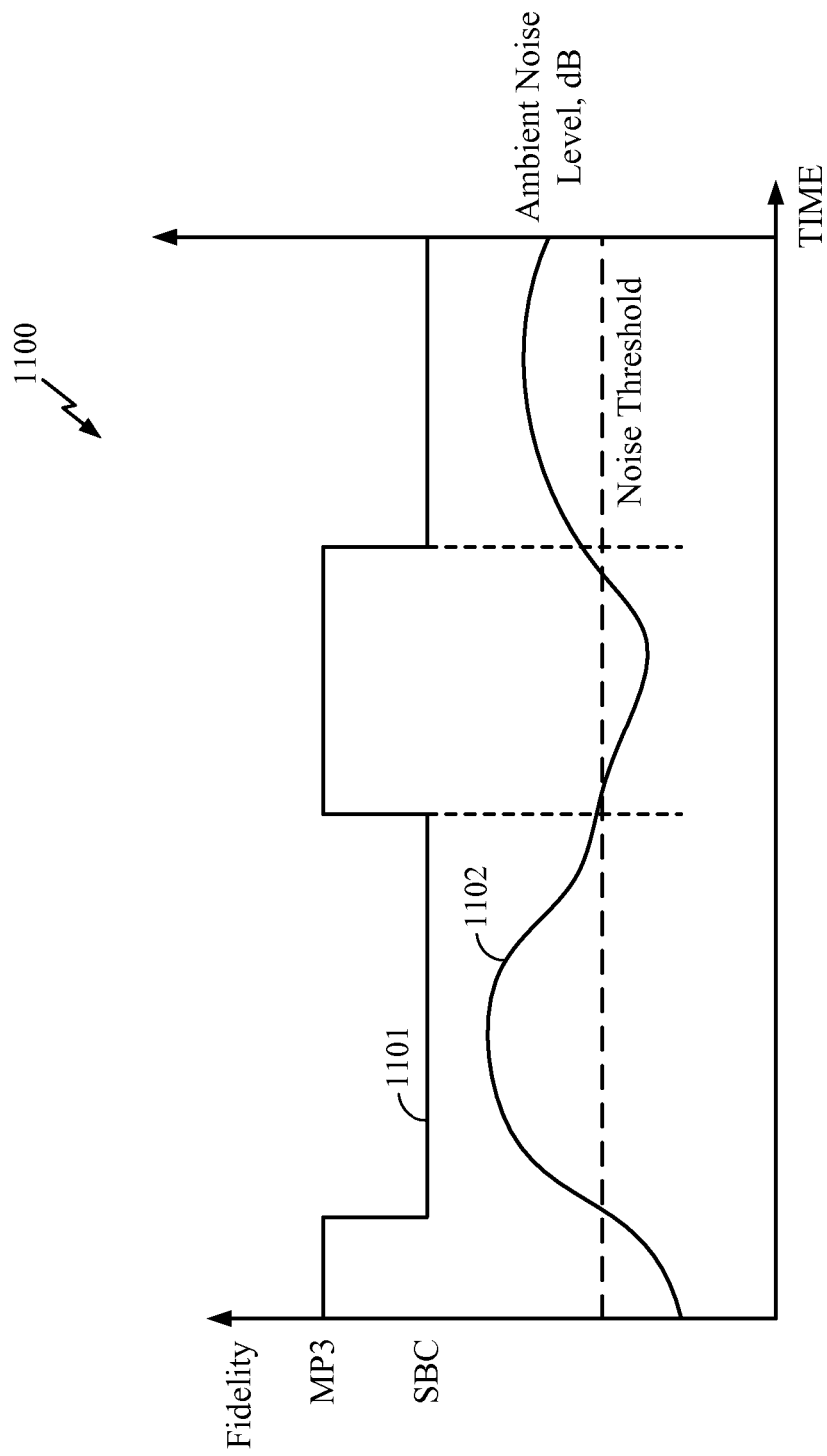
FIG. 11 is a graph illustrating switching between audio coding processes based on an ambient noise level.

FIG. 11 is an exemplary graph 1100 illustrating switching between audio coding processes based on an ambient noise level. The upper line 1101 of the graph 1100 depicts the selection of a high-fidelity codec (e.g., MP3) or a low-fidelity codec (e.g., SBC). The lower curve 1102 of the graph depicts the measured ambient noise level. When the measured ambient noise level is below a noise threshold value, e.g., 20 dBA, the high-fidelity codec is selected for audio processing at the headset. When the measured ambient noise level is above the noise threshold value, the low-fidelity (i.e., low-power) codec is selected for audio processing at the headset.

Figure 12:
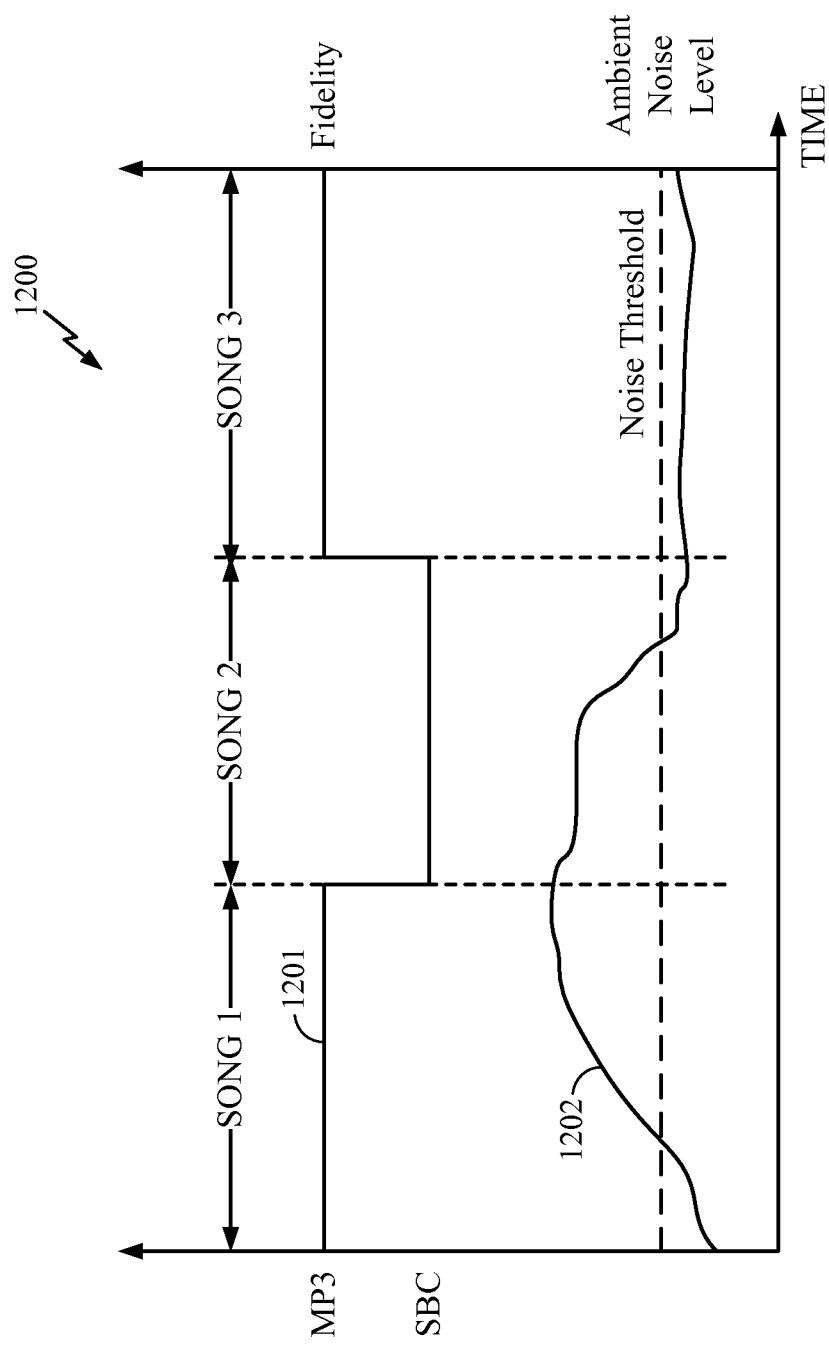
FIG. 12 is a graph illustrating switching between audio coding processes at song boundaries during headset audio playback.

FIG. 12 is an exemplary graph 1200 illustrating switching between audio coding processes at song boundaries during headset audio playback. The upper line 1201 of the graph 1200 depicts the selection of a high-fidelity codec (e.g., MP3) or a low-fidelity codec (e.g., SBC) over time. The lower curve 1202 of the graph depicts the measured ambient noise level over time. When the measured ambient noise level is below a noise threshold value, the high-fidelity codec may be selected for audio processing at the headset. When the measured ambient noise level is above the noise threshold value, the low-fidelity (i.e., low power) codec may be selected for audio processing at the headset. However, codec switching occurs only at song boundaries or during other periods of silence so as to prevent audio glitches that may be heard by user, caused by codec switch during audio output. In the example shown, during Song 1, the ambient noise level increases above the noise threshold value, but the transition from the high-fidelity codec (MP3) to the low-fidelity codec (SBC) is deferred until the boundary between Song 1 and Song 2 occurs. The ambient noise level decreases below the noise threshold during Song 2, but the audio codec is not switched from the low-fidelity codec to the high-fidelity codec until the silent boundary between Songs 2 and 3 occurs.

Figure 13:
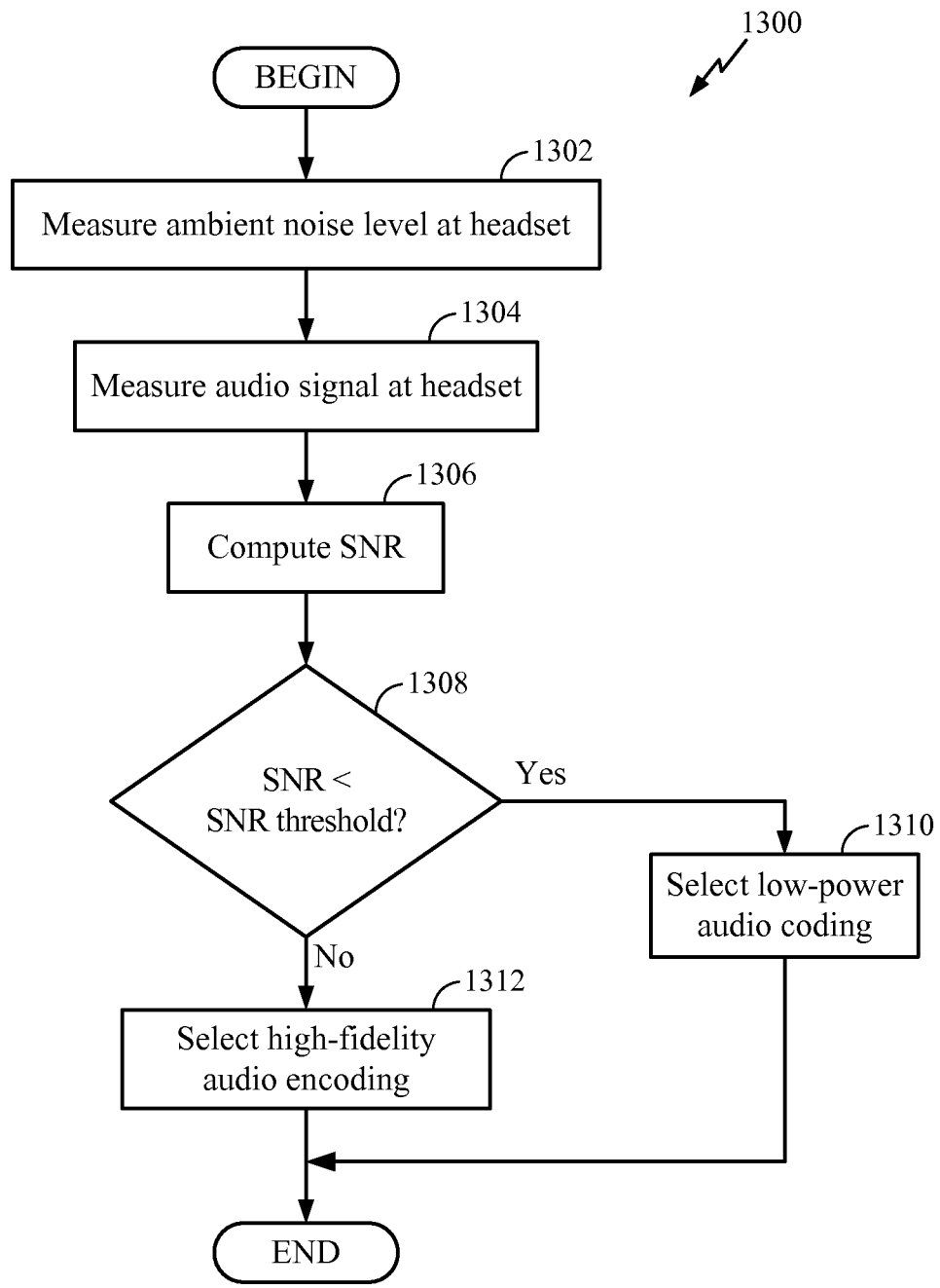
FIG. 13 is a flowchart illustrating a fourth method of selecting an audio coding process for a wireless headset.

FIG. 13 is a flowchart illustrating a fourth method 1300 of selecting an audio coding process for a wireless headset. In block 1302, the ambient noise level at the headset is measured. In block 1304, the strength of an incoming audio signal is measured. In block 1306, the signal-to-noise ratio (SNR) of the incoming audio signal to the ambient noise level is computed. In decision block 1308, the computed SNR is compared to an SNR threshold value to determine whether the headset is in an environment that is relatively noisy enough that a user would not typically hear the difference between audio output from a low-fidelity codec or high-fidelity audio codec. If the SNR is below the threshold value, e.g., <70 dB, a low-power, low-fidelity audio coding process is selected for the headset (block 1310). If not, a high-fidelity audio coding process is selected for the headset (block 1312). The low-power audio coding process consumes less power than the high-fidelity audio coding process during audio processing at the headset, and thus allows the headset to operate longer.

When playing back in noise-canceling headphones, the high-fidelity coding process may be selected irrespective of the ambient noise level.

Figure 14:
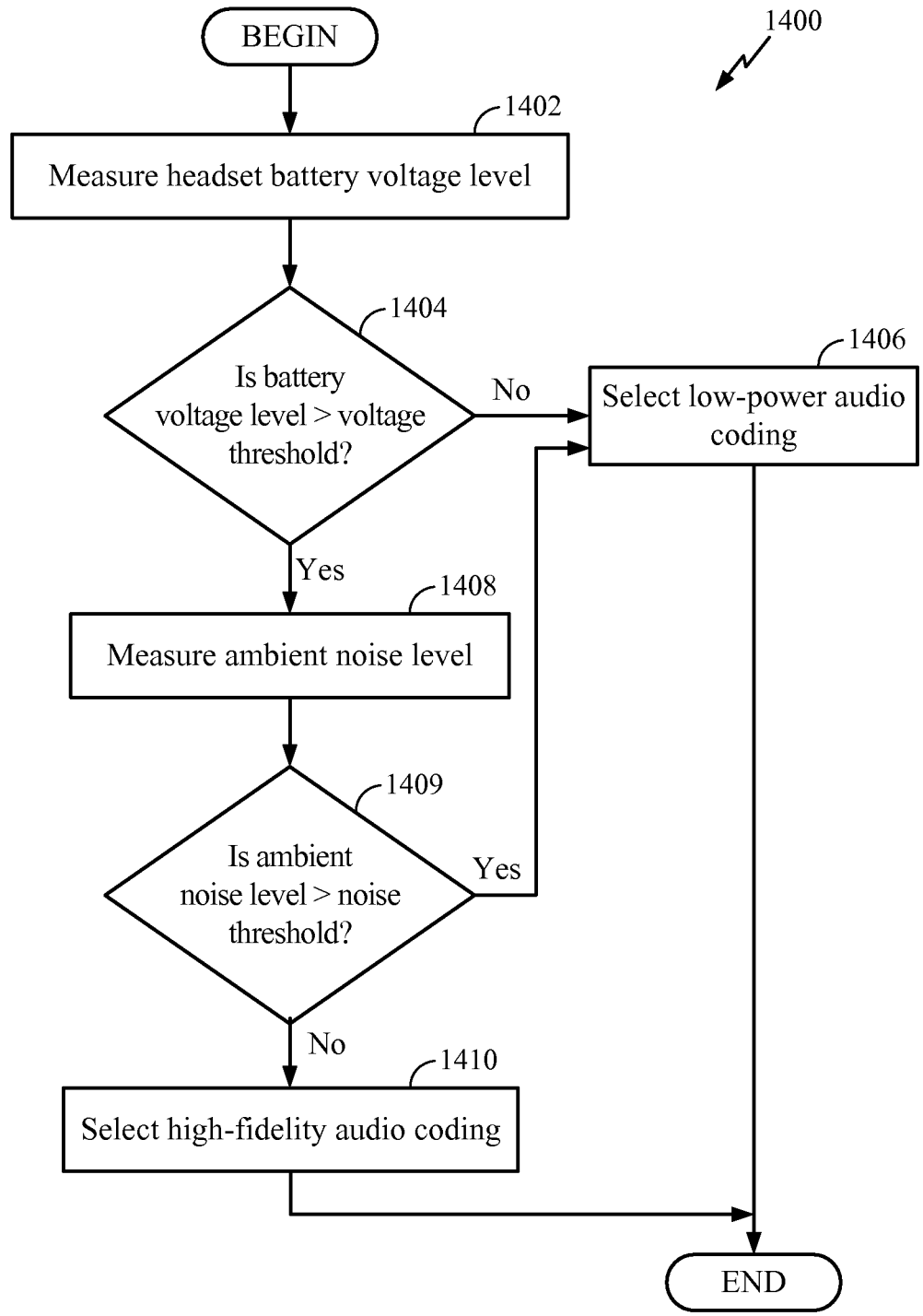
FIG. 14 is a flowchart illustrating a fifth method of selecting an audio coding process for a wireless headset.

FIG. 14 is a flowchart illustrating a fifth method 1400 of selecting an audio coding process for a wireless headset. In block 1402, the battery voltage level, which indicates the remaining battery energy capacity, of the headset is measured. In decision block 1404, the battery voltage level is compared to a voltage threshold value to determine whether the battery is running low, and thus, indicating a need to operate the headset in a low-power mode. If the measured battery voltage level is below the threshold, a low-power audio coding process is selected for the headset (block 1406). If not, in block 1408, the ambient noise level at the headset is measured. In decision block 1409, the ambient noise level is compared to a noise threshold value to determine whether the headset is in an environment that is noisy enough that a user would not typically hear the difference between audio output from a low-fidelity codec or high-fidelity audio codec. If the measured ambient noise level is above the threshold value, a low-power, low-fidelity audio coding process is selected for the headset (block 1406). If not, a high-fidelity audio coding process is selected for the headset (block 1410). The low-power audio coding process consumes less power than the high-fidelity audio coding process during audio processing at the headset, and thus allows the headset to operate longer.

Figure 15:
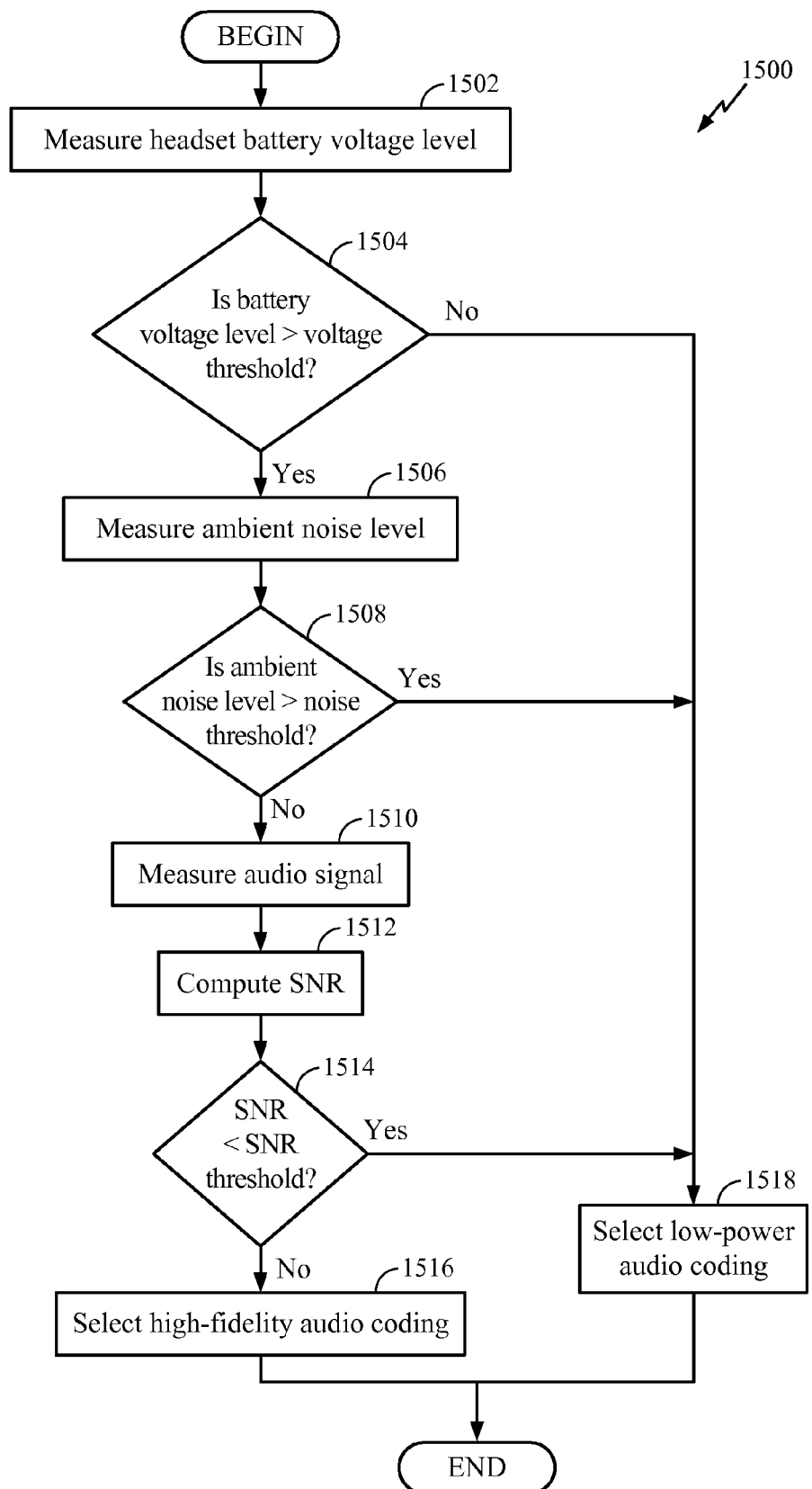
FIG. 15 is a flowchart illustrating a sixth method of selecting an audio coding process for a wireless headset.

FIG. 15 is a flowchart illustrating a sixth method 1500 of selecting an audio coding process for a wireless headset. In block 1502, the battery voltage level of the headset is measured. In decision block 1504, the battery voltage level is compared to a voltage threshold value to determine whether the battery is running low, and thus, indicating a need to operate the headset in a low-power mode. If the measured battery voltage level is below the threshold, a low-power audio coding process is selected for the headset (block 1518). If not, in block 1506, the ambient noise level at the headset is measured. In decision block 1508, the ambient noise level is compared to a noise threshold value to determine whether the headset is in an environment that is noisy enough that a user would not typically hear the difference between audio output from a low-fidelity codec or high-fidelity audio codec. If the measured ambient noise level is above the threshold value, the low-power, low-fidelity audio coding process is selected for the headset (block 1518). If not, the strength of an audio signal output by the headset is measured (block 1510). In block 1512, the signal-to-noise ratio (SNR) of the incoming audio signal to the ambient noise level is computed. In decision block 1514, the computed SNR is compared to an SNR threshold value to determine whether the headset is in an environment that is relatively noisy enough that a user would not typically hear the difference between audio output from a low-fidelity codec or high-fidelity audio codec. If the SNR is below the threshold value, a low-power, low-fidelity audio coding process is selected for the headset (block 1518). If not, a high-fidelity audio coding process is selected for the headset (block 1516). The low-power audio coding process consumes less power than the high-fidelity audio coding process during audio processing at the headset, and thus allows the headset to operate longer.

The functionality of the systems, devices, headsets and their respective components, as well as the method steps and blocks described herein may be implemented in hardware, software, firmware, or any suitable combination thereof. The software/firmware may be a program having sets of instructions (e.g., code segments) executable by one or more digital circuits, such as microprocessors, DSPs, embedded controllers, or intellectual property (IP) cores. If implemented in software/firmware, the functions may be stored on or transmitted over as instructions or code on one or more computer-readable media. Computer-readable medium includes both computer storage medium and communication medium, including any medium that facilitates transfer of a computer program from one place to another. A storage medium may be any available medium that can be accessed by a computer. By way of example, and not limitation, such computer-readable medium can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable medium.

Certain embodiments have been described. However, various modifications to these embodiments are possible, and the principles presented herein may be applied to other embodiments as well. For example, the principles disclosed herein may be applied to other devices, such as wireless devices including personal digital assistants (PDAs) and cellular phones, speakers, personal computers, stereo systems, video games and the like. Also, the principles disclosed herein may be applied to wired headsets, where the communications link between the headset and an audio source is a wire, rather than a wireless link. In addition, the various components and/or method steps/blocks may be implemented in arrangements other than those specifically disclosed without departing from the scope of the claims.

Other embodiments and modifications will occur readily to those of ordinary skill in the art in view of these teachings. Therefore, the following claims are intended to cover all such embodiments and modifications when viewed in conjunction with the above specification and accompanying drawings.

What is claimed is:

1. An apparatus, comprising:
   a sensor configured to determine an ambient noise level at a device; and
   a selector implemented at least partially in hardware and configured to select a first audio coding process for the device if the ambient noise level is above a threshold noise level, the first audio coding process consuming less power than a second audio coding process during audio processing at the device, the selector selecting the second audio coding process if the ambient noise level is below the threshold noise level.

2. The apparatus of claim 1, wherein the selector selects either the first audio coding process or the second audio coding process based on a combination of a remaining battery energy capacity of the device and the ambient noise level.

3. The apparatus of claim 1, wherein the selector selects either the first audio coding process or second audio coding process based on a signal-to-noise ratio (SNR) determined from the ambient noise level.

4. The apparatus of claim 1, further comprising:
   a detector configured to detect one or more boundaries in an audio stream;
   wherein the selector is further configured to switch between the first audio coding process and the second audio coding process at one of the boundaries.

5. The apparatus of claim 4, wherein the boundaries include a period of silence.

6. The apparatus of claim 1, further comprising:
   an interface, included in the device, configured to transfer the ambient noise level to another device.

7. The apparatus of claim 1, wherein the sensor and selector are included in the device.

8. The apparatus of claim 1, wherein the sensor is included in the device and the selector is included in a wireless communication device.

9. The apparatus of claim 1, wherein the device is a wireless headset.

10. A method, comprising:
    determining an ambient noise level at a device;
    selecting a first audio coding process for the device if the ambient noise level is above a threshold noise level, the first audio coding process consuming less power than a second audio coding process during audio processing at the device; and
    selecting the second audio coding process if the ambient noise level is below the threshold noise level.

11. The method of claim 10, further comprising:
    measuring a remaining battery energy capacity of the device, wherein selecting the first audio coding process or the second audio coding process is based on the remaining battery energy capacity.

12. The method of claim 10, further comprising:
    measuring a remaining battery energy capacity; and
    measuring the ambient noise level;
    wherein selecting the first audio coding process or the second audio coding process is based on the remaining battery energy capacity and the ambient noise level.

13. The method of claim 10, further comprising:
    measuring the ambient noise level; and
    measuring an audio signal;
    wherein selecting the first audio coding process or the second audio coding process is based on a signal-to-noise ratio (SNR) of the audio signal to the ambient noise level.

14. The method of claim 10, further comprising:
    detecting one or more boundaries in an audio stream; and
    switching between the first audio coding process and the second audio coding process at one of the boundaries.

15. The method of claim 14, wherein the boundaries include a period of silence.

16. The method of claim 10, further comprising:
    transferring the ambient noise level from the device to another device.

17. The method of claim 10, wherein the device is a wireless headset.

18. An apparatus, comprising:
  means for determining an ambient noise level at a device;
  means for comparing the ambient noise level to a threshold noise level; and
  means for selecting a first audio coding process for the device if the ambient noise level is above the threshold noise level and selecting a second audio coding process consuming more power than the first audio coding process if the ambient noise level is below the threshold noise level.

19. The apparatus of claim 18, further comprising:
  means for measuring a device remaining battery energy capacity, wherein selecting the first audio coding process or the second audio coding process is based on the device remaining battery energy capacity.

20. The apparatus of claim 18, further comprising:
  means for measuring the ambient noise level.

21. The apparatus of claim 18, further comprising:
  means for measuring a device remaining battery energy capacity; and
  means for measuring the ambient noise level;
  wherein selecting the first audio coding process or the second audio coding process is based on the device remaining battery energy capacity and the ambient noise level.

22. The apparatus of claim 18, further comprising:
  means for measuring the ambient noise level; and
  means for measuring an audio signal;
  wherein selecting the first audio coding process or the second audio coding process is based on a signal-to-noise ratio (SNR) of the audio signal to the ambient noise level.

23. The apparatus of claim 18, further comprising:
  means for detecting one or more boundaries in an audio stream; and
  means for switching between the first audio coding process and the second audio coding process at one of the boundaries.

24. The apparatus of claim 23, wherein the boundaries include a period of silence.

25. The apparatus of claim 18, further comprising:
  means for transferring the ambient noise level from the device to another device.

26. The apparatus of claim 18, wherein the device is a wireless headset.

27. A non-transitory computer-readable medium embodying a set of instructions executable by one or more processors, comprising:
  code for determining an ambient noise level at a device; and
  code for selecting a first audio coding process for the device if the ambient noise level is above a threshold noise level, the first audio coding process consuming less power than a second audio coding process during audio processing at the device; and
  code for selecting the second audio coding process if the ambient noise level is below the threshold noise level.

28. The computer-readable medium of claim 27, further comprising:
  code for measuring a remaining battery energy capacity, wherein selecting the first audio coding process or second audio coding process is based on the remaining battery energy capacity.

29. The computer-readable medium of claim 27, further comprising:
  code for measuring a remaining battery energy capacity; and
  code for measuring an ambient noise level;
  wherein selecting the first audio coding process or the second audio coding process is based on the remaining battery energy capacity and the ambient noise level.

30. The computer-readable medium of claim 27, further comprising:
  code for measuring an ambient noise level; and
  code for measuring an audio signal;
  wherein selecting the first audio coding process or the second audio coding process is based on a signal-to-noise ratio (SNR) of the audio signal to the ambient noise level.

31. The computer-readable medium of claim 27, further comprising:
  code for detecting one or more boundaries in an audio stream; and
  code for switching between the first audio coding process and the second audio coding process at one of the boundaries.

32. The computer-readable medium of claim 31, wherein the boundaries include a period of silence.

33. The computer-readable medium of claim 27, further comprising:
  code for transferring the ambient noise level from the device to another device.

34. The computer-readable medium of claim 27, wherein the device is a wireless headset.

* * * * *